(12) United States Patent
Lau et al.

(10) Patent No.: US 6,404,283 B1
(45) Date of Patent: Jun. 11, 2002

(54) METHOD AND APPARATUS FOR AMPLIFYING A RADIO FREQUENCY SIGNAL

(75) Inventors: Sin Kai Henry Lau, Scottsdale; Glenn Watanabe, Phoenix, both of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/639,126

(22) Filed: Aug. 18, 2000

(51) Int. Cl.[7] .............................. H03G 3/20; H03G 5/16; H03F 1/14
(52) U.S. Cl. ..................... 330/129; 330/51; 330/133; 330/134; 455/241.4
(58) Field of Search ...................... 330/51, 129, 133, 330/134; 455/241.1, 251.1, 253.2

(56) References Cited

U.S. PATENT DOCUMENTS

| | | | |
|---|---|---|---|
| 5,331,290 A | * | 7/1994 | Harford et al. |
| 5,459,433 A | | 10/1995 | Fenk et al. .................. 330/254 |
| 5,999,056 A | * | 12/1999 | Fong |
| 6,211,737 B1 | * | 4/2001 | Fong |
| 6,259,323 B1 | * | 7/2001 | Salminen |

* cited by examiner

Primary Examiner—Robert Pascal
Assistant Examiner—Patricia T. Nguyen
(74) Attorney, Agent, or Firm—Mark J. Fink

(57) ABSTRACT

The present invention concerns a method for variable linear amplification and an apparatus for a variable linear amplifier, which is particularly suited for RF communication applications. One embodiment includes a high gain circuit in communication with a transconductor to receive an RF signal, a low gain circuit in communication with the transconductor and a current dissipation circuit in communication with the transconductor and a ground source. In one embodiment, the high gain circuit is a NMOS device which is characteristically larger than the low gain device.

20 Claims, 2 Drawing Sheets

METHOD AND APPARATUS FOR AMPLIFYING A RADIO FREQUENCY SIGNAL

FIELD OF THE INVENTION

The present invention relates to the field of signal amplification, and more particularly, to a method and apparatus for amplifying a radio frequency (RF) signal employed, for example, in wireless communication devices.

BACKGROUND OF THE INVENTION

Typical RF communication devices (or similar wireless devices such as cellular phones, for example) receive RF signals from a RF transmission source or similar transmission base (such as a cellular phone transmission tower or RF base unit, for example). If the operator is located near the RF transmission source, the RF communication device does not need to amplify or provide gain to the RF signal received because the RF signal received by the communication device is strong enough to be easily processed by the communication processing circuits within the RF communication device. However, if the operator is further away from the RF base as determined by the signal strength from signal strength indicator circuitry (such as, for example, item 61 in FIG. 1, which could include a received signal strength indicator or RSSI), the RF signal received by the RF communication device may be weak. Further, the RF signal may be near other signals having the same or similar frequency. In these cases, the RF signal received is difficult to process. Therefore, in such situations, the RF communication device must be able to amplify or provide gain to the RF signal received which originates from a far away source.

For example, when an operator is using a RF communication device remotely located from the RF transmitting source, the RF amplifier is engaged to amplify the incoming RF signal (an electromagnetic signal or wave) to allow processing by processing circuitry. When the operator is closer to the RF transmitting source, the incoming RF signal is relatively strong (corresponding to a high electromagnetic signal) which means that the RF amplifier must switch to a lower gain state (or amplification state). If the large RF signal continues to be amplified when near a RF transmitting source, the RF communication device's processing circuitry would be overloaded and will not function. Thus, a lower gain amplification state is required when near a RF transmitting source.

Linearity is an important characteristic in the design of wireless communications devices because linear amplifiers provide an RF amplified signal without, for example, degradation of the signal due to third order intermodulation. Usually, RF wireless devices employ bipolar transistor technology to amplify the incoming RF input signal. While most prior art RF variable gain bipolar amplifiers can change the amount of amplification or gain applied to the received RF signal by changing the direct current (DC) bias current flowing through the amplifiers, such amplifiers suffer because the amplifiers employed are not linear in the low gain mode because of the low DC bias current. Thus, if the RF signal contains additional unwanted large amplitude signals (such as, for example, interferers, which differs slightly from the desired RF signal in frequency), and these signals experience third order nonlinearity from the amplification process of the amplifier, the resulting effect of the third order nonlinearity between the two interferers can be a false signal created on the same frequency as the desired amplified signal. This resulting signal is known as the third order intermodulation product. The third order intermodulation product is a signal at the same frequency of the desired RF signal which corrupts the desired RF signal. In any event, the resulting intermodulation product signal may be difficult to process correctly by the RF communication device's processing circuitry.

Maintaining linearity of the RF amplifier is therefore an important consideration in RF communication design because a highly linear RF amplifier will be able to provide the desired RF signal to the RF communication device's processing circuitry at the correct frequency while minimizing the effects of third order intermodulation. Thus, there is a need for a method for variable linear amplification and an apparatus for a variable linear amplifier, particularly suited for RF communication applications, which amplifies in a linear fashion so that a desired RF input signal corresponds to a desired RF output signal transmitted to the RF communication device's processing circuitry without corruption from third order intermodulation. Further, it is desirable that the amplifier in RF communication devices should be able to maintain a constant input and output impedance from the low gain to high gain mode so that the filters before and after the amplifier will operate properly.

BRIEF DESCRIPTION OF THE DRAWINGS

The accompanying Figures, where like reference numerals refer to identical or functionally-similar elements throughout the separate views and which are incorporated in and form part of the specification, further illustrate the present invention and, together with the detailed description of the drawings, serve to explain the principles of the present invention.

DETAILED DESCRIPTION OF THE DRAWINGS

Figure 1:
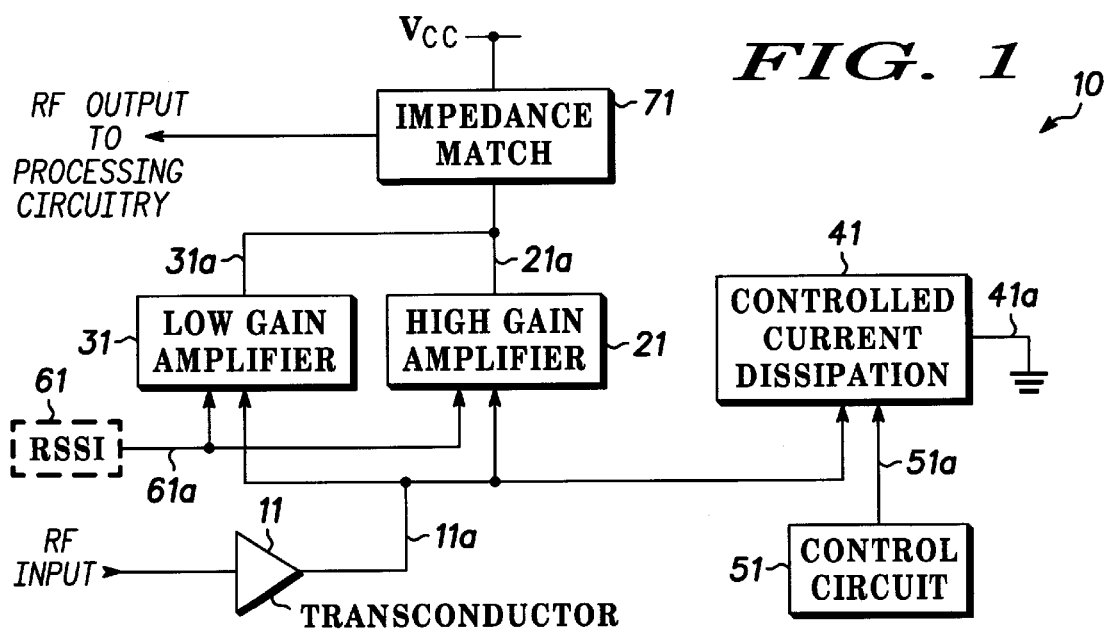
FIG. 1 is a schematic block diagram illustrating an embodiment of a configuration according to the present invention.

The present invention concerns a method for variably amplifying a RF signal and an apparatus for variable linear amplification. In accordance with one embodiment of the present invention, and referring to FIG. 1, the present method and apparatus 10 includes a controllable high gain circuit 21 in communication with a transconductor 11 that receives an RF input signal, a controllable low gain circuit 31 in communication with the transconductor 11 and a controllable current dissipation circuit 41 in communication with the transconductor 11 and a ground source. The transconductor 11 is preferably a voltage to current or power to current conversion circuit such as, for example, those typically used in RF communication devices. Because the same amount of DC bias current flows through transconductor 11 when switching from the low gain mode to the high gain mode, the input impedance at the RF input does not change.

In operation, and referring to FIG. 1, a RF input signal is received by the RF communication device and transmitted to the transconductor 11 resulting in a transconducted signal or electrical current signal 11a. The transconducted signal 11a is coupled to the high gain circuit 21, the low gain circuit 31 and the current dissipation circuit 41. If the RF communication device is located remotely or far away from the RF transmitting source as determined by an external RSSI within a control circuit 61, control circuit 61 controls high gain circuit 21 via control signal 61*a* to receive the transconducted signal or current 11*a* and amplify or provide gain to the transconducted signal 11*a* while preventing the low gain circuit 31 from modifying the transconducted signal 11*a*. A resulting high gain signal 21*a* is generated which is transmitted to an impedance matching circuitry 71 to generate a RF output signal. The large DC current bias allows the high gain circuit 21 to be a linear circuit and the RF output signal is now substantially free of the undesired third order intermodulation product which can corrupt the desired signal. The RF output signal is a low noise amplified signal which is transmitted to the communication device's processing circuitry for further communication processing.

If the RF communication device is located near the RF transmitting source, control circuit 61 controls low gain circuit 31 to receive the transconducted signal 11*a* and provides low amplification or insubstantial gain to a portion of the transconducted signal 11*a* while preventing the high gain circuit 21 from modifying the transconducted signal 11*a*. Because the low gain circuit 31 is selected to pass the same amount of electrical current in transconducted signal 11*a*, it receives most or all of the current corresponding to the transconducted signal 11*a*. As those of skill in the art will now come to realize, maintaining the current high in the low gain path preserves the high linearity of the amplifier.

In the case where there is a low supply voltage Vcc, simultaneously a dissipation control circuitry means 51 controls current dissipation circuit 41 to receive a portion of the transconducted signal 11*a* which is not transmitted through the low gain circuit 31 and transmit such remaining current to a ground source. As those of skill in the art will now come to realize, dissipation control circuitry means 51 diverts the desired current away from low gain circuit 31 to prevent the gate to source voltage of low gain circuit 31 from being too large whenever the low gain mode is set as determined by the control circuitry 61. A resulting low gain or insubstantial current signal 31*a* is generated which is transmitted to the impedance matching circuitry 71 to generate a RF output signal. Because the low gain circuit 31 is a linear circuit, the RF output signal is now substantially free of undesired frequency signals (such as, for example, third order intermodulation products) when insubstantial amplification of the RF input signal is provided. The RF output signal or power output is a low noise signal which is transmitted to the communication device's processing circuitry for further processing.

In one preferred embodiment, the high gain circuit 21 is a common gate amplifier controlled by a control circuit 61 by methods known to those of skill in the art. Additionally, the high gain circuit 21, in one embodiment is a high gain metal oxide semiconductor field effect transistor (MOSFET) amplifier. Preferably, the high gain MOSFET amplifier 21 is a n-channel metal-oxide semiconductor (NMOS) device with a width to length ratio characteristically larger than low gain circuit 31. Thus, as seen in FIG. 2, an exemplary high gain circuit 21 may include a device having 16 gates (number of gates or NG) where each gate has a 0.4 micron length (LG) and the width of each gate is 16 microns (WG) such as manufactured by Motorola for example, part numbers MBC13706 or MBC13707.

Again referring to FIG. 1, the low gain circuit 31 is also preferably a common gate amplifier controlled by control circuit 61 by methods known to those of skill in the art, and in one embodiment is electrically structured in parallel with high gain circuit 21. Low gain circuit 31 is preferably a low gain metal oxide semiconductor field effect transistor (MOSFET) amplifier. Preferably, the low gain MOSFET amplifier 31 is a n-channel metal-oxide semiconductor (NMOS) device with a width to length ratio characteristically smaller than high gain circuit 21. Thus, as seen in FIG. 2, an exemplary low gain circuit 31 may be a device having 3 gates (number of gates or NG) where each gate has a 16 micron width (WG) and the length of each gate is 0.4 micron (LG) such as manufactured by Motorola for example, part numbers MBC13706 or MBC13707.

The current dissipation circuit 41, as seen in FIG. 1, is in communication with and controlled by a dissipation control circuitry means 51. In one embodiment, the current dissipation circuit 41 is a metal oxide semiconductor field effect transistor (MOSFET) amplifier. Preferably, as seen in FIG. 2, the current dissipation MOSFET circuit 41 is a n-channel metal-oxide semiconductor (NMOS) device characteristically including 64 gates (number of gates or NG) where each gate has a 16 micron width (WG) and the length of each gate is 0.4 micron (LG) such as manufactured by Motorola for example, part numbers MBC13706 or MBC13707.

Figure 2:
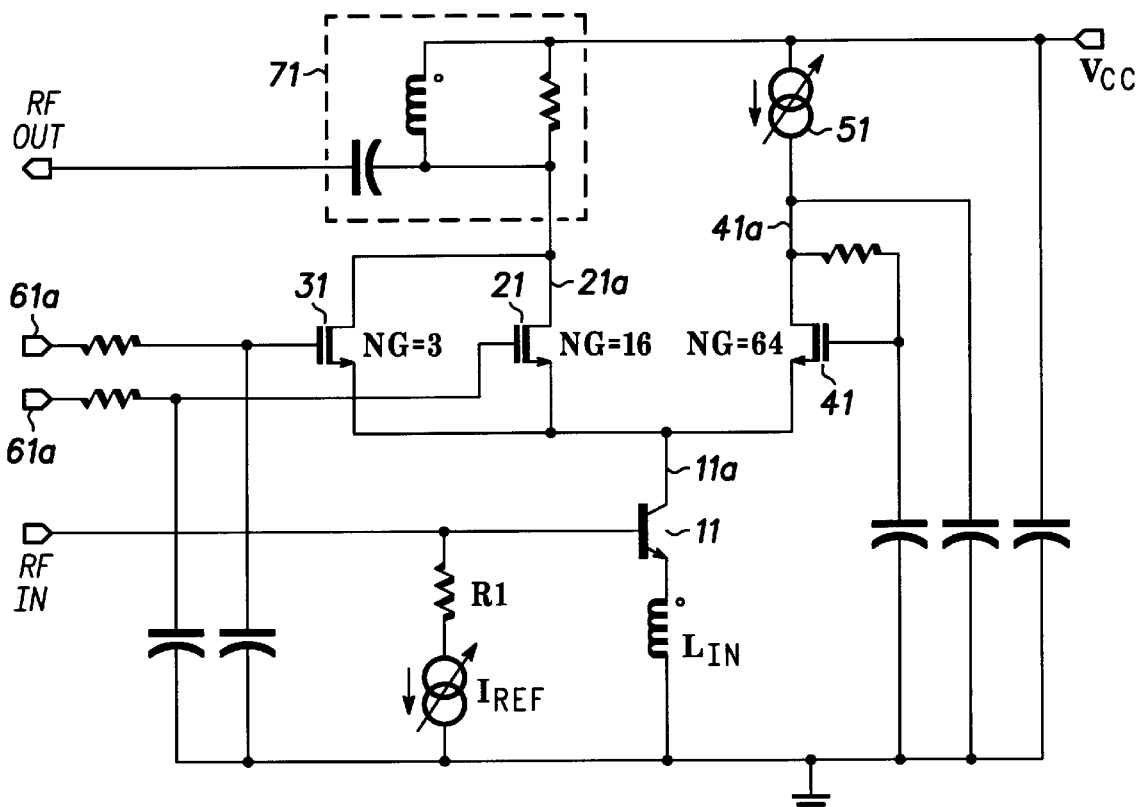
FIG. 2 illustrates one embodiment of the block diagram corresponding to FIG. 1.

FIG. 2 illustrates one preferred embodiment according to the present invention. As those of skill in the art will know, the particular design and values illustrated in FIG. 2 are exemplary and are not intended to limit the scope of the present invention.

Figure 3:
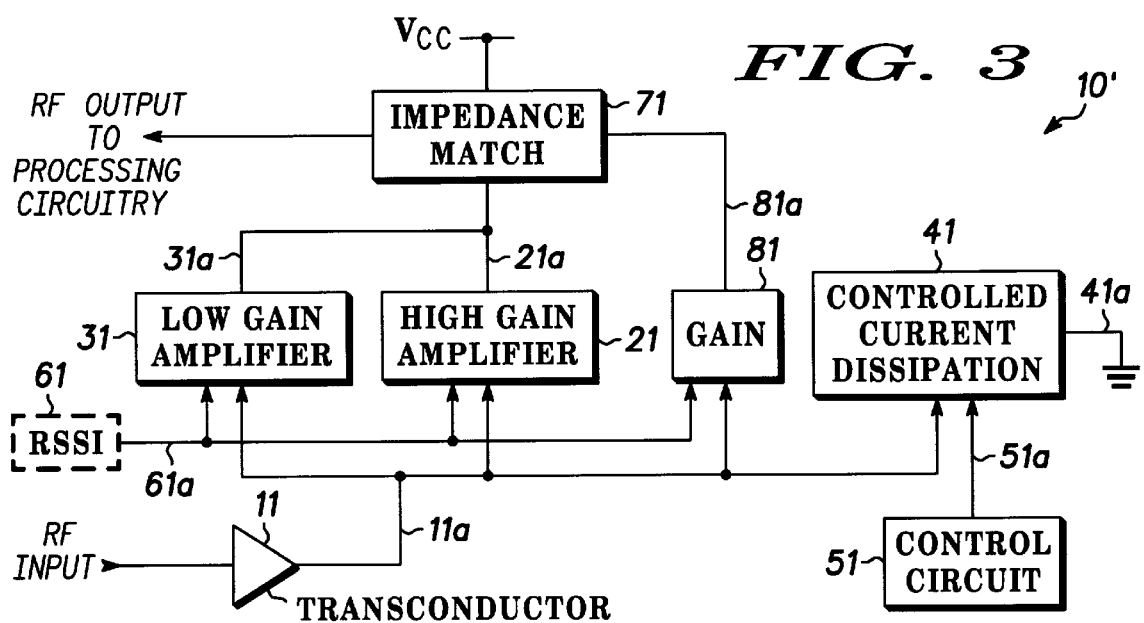
FIG. 3 illustrates another embodiment of the block diagram corresponding to FIG. 1.

FIG. 3 illustrates an alternate embodiment 10 in accordance with the present invention. In this embodiment, one or more gain circuits 81 are controlled by control circuit 61 and electrically communicate with and are electrically structured in parallel with low gain circuit 31 and high gain circuit 21. While high gain circuit 21 provides high gain to transconducted signal 11*a* and low gain circuit 31 provides low gain to transconducted signal 11*a*, control circuit 61 can be used to control each gain circuit 81 to provide selective or variable gain to the transconducted signal 11*a* resulting in a variable gain signal 81*a*. A resulting variable gain signal 81*a* is generated which is transmitted to the impedance matching circuitry 71 to generate a RF output signal. Because the variable gain circuit 81 is a linear circuit, the RF output signal is now substantially free of undesired frequency signals (such as for example third order intermodulation products) when insubstantial amplification of the RF input signal is provided. The RF output signal or power output is a low noise signal which is transmitted to the communication device's processing circuitry for further communication processing.

As those of skill in the art will realize, the present invention can be implemented by individual discrete components, on an integrated circuit or like device (such as, for example, a microchip) or by a combination of both The exact implementation is a choice which remains within the spirit and the scope of the present invention.

Other variations and modifications of the present invention will be apparent to those of ordinary skill in the art, and it is the intent of the appended claims that such variations and modifications be covered. The particular values and configurations discussed above can be varied, are cited to illustrate particular embodiments of the present invention and are not intended to limit the scope of the invention. It is contemplated that the use of the present invention can involve components having different characteristics as long as the principle, the presentation of a method and apparatus for amplifying a radio frequency signal, is followed.

What is claimed is:

1. A variable gain amplifier in a wireless device having a transconductor including a radio frequency input, a control circuit and an impedance matching circuit having a radio frequency output, the amplifier comprising:

a) a high gain circuit in communication with the transconductor and the impedance matching circuit, the high gain circuit controlled by the control circuit;

b) a low gain circuit in communication with the transconductor, the high gain circuit and the impedance matching circuit, the low gain circuit controlled by the control circuit; and c) a controllable current dissipation circuit in communication with the transconductor, a ground source and the impedance matching circuit.

2. The variable gain amplifier of claim 1 wherein the controllable current dissipation circuit is controlled by and in communication with a dissipation control means.

3. The variable gain amplifier of claim 2 wherein the transconductor is a power to current conversion circuit.

4. The variable gain amplifier of claim 3 further including at least one gain circuit in communication with the high gain circuit, the low gain circuit and the current dissipation circuit.

5. The variable gain amplifier of claim 4 wherein the high gain circuit NMOS device characteristically including WG=16 microns, LG=0.4 micron and NG=16 gates.

6. The variable gain amplifier of claim 5 wherein the low gain circuit is a NMOS device characteristically including WG=16 microns, LG=0.4 micron and NG=3 gates.

7. The variable gain amplifier of claim 5 wherein the current dissipation circuit is a NMOS device characteristically including NG=64 gates, LG=0.4 micron and WG=16 microns.

8. A variable gain amplifier comprising:

a) a transconductor having a radio frequency input;

b) a high gain circuit in communication with the transconductor and controlled by a control circuit;

c) a low gain circuit in communication with the transconductor and high gain circuit, the low gain circuit controlled by the control circuit;

d) a current dissipation circuit in communication with the transconductor and a ground source;

e) a dissipation control means for controlling the current dissipation circuit, the dissipation control means in communication with the current dissipation circuit; and f) an impedance matching circuit in communication with the high gain circuit, the low gain circuit and the current dissipation circuit, the impedance matching circuit having an RF output.

9. The variable gain amplifier of claim 8 wherein the high gain circuit is a high gain common gate amplifier NMOS device.

10. The variable gain amplifier of claim 8 wherein the low gain circuit is a low gain common gate amplifier NMOS device.

11. The variable gain amplifier of claim 8 further including a plurality of variable gain circuits in communication with the high gain circuit, the low gain circuit and the current dissipation circuit.

12. A method for providing linear amplification to a radio frequency (RF) signal received by a wireless device from an RF transmitting source, the wireless device having a transconductor including a radio frequency input, a control circuit and an impedance matching circuit having a radio frequency output, the method comprising the steps of:

a) introducing a high gain circuit in communication with the transconductor and the impedance matching circuit, the high gain circuit controlled by the control circuit;

b) introducing a low gain circuit in communication with the transconductor, the high gain circuit and the impedance matching circuit, the low gain circuit controlled by the control circuit; and c) introducing a controllable current dissipation circuit in communication with the transconductor, a ground source and the impedance matching circuit, the controllable current dissipation circuit being controlled by and in communication with a dissipation control means.

13. The method for providing linear amplification of claim 12 further including at least one gain circuit in communication with the high gain circuit, the low gain circuit and the current dissipation circuit.

14. A method for achieving variable linear amplification in radio frequency (RF) applications comprising the steps of:

a) introducing a transconductor having an RF input bus;

b) providing a controllable high gain circuit and a controllable low gain circuit in communication with the transconductor, the high gain circuit in communication with the low gain circuit, the high gain and low gain having a common RF output bus;

c) providing a controllable current dissipation circuit in communication with the transconductor and a ground source, the controllable current dissipation circuit further in communication with a ground source;

d) providing a current dissipation controller in communication with the current dissipation circuit;

e) transconducting an RF input signal by the transconductor;

f) amplifying the RF signal through the high gain circuit when the RF input signal originates from a far RF transmitting source and outputting a high gain RF output signal to the processing circuitry;

g) amplifying the RF signal through the low gain circuit when the RF input signal originates from a nearby RF transmitting source, allowing a portion of the RP signal current to be dissipated by the current dissipation circuit, and outputting a low gain RF output signal to the processing circuitry.

15. The method for achieving variable linear amplification of claim 14 further including a plurality of variable gain circuits in communication with the high gain circuit, the low gain circuit and the current dissipation circuit.

16. A method for amplifying a radio frequency (RF) signal comprising the steps of:

a) transconducting the RF signal resulting in a transconductance signal;

b) amplifying the transconductance signal through a first controllable circuit when the RF signal originates from a far away RF transmitting source resulting in a high gain RF output signal and transmitting the high gain RF output signal to processing circuitry; and c) amplifying a desired portion of the transconductance signal through a second controllable circuit when the RF signal originates from a nearby RF transmitting source resulting in a low gain RF output signal, transmitting an undesired portion of the transconductance signal through a third controllable circuit and transmitting the low gain RF output signal to processing circuitry.

17. The method for amplifying a RF signal of claim 16 wherein the high gain circuit is a high gain common gate amplifier NMOS device.

18. The method for amplifying an RF signal of claim 16 wherein the low gain circuit is a low gain common gate amplifier NMOS device.

19. The method for amplifying an RF signal of claim 16 further including a plurality of variable gain circuits in communication with the high gain circuit, the low gain circuit and the third controllable circuit, the third controllable circuit further including a current dissipation circuit.

20. The method for amplifying an RF signal of claim 19 wherein the current dissipation circuit is a common gate amplifier NMOS device.

* * * * *